United States Patent [19]

Friberg et al.

[11] 4,161,708
[45] Jul. 17, 1979

[54] ELECTRONIC TUNING SYSTEM WITH DIGITAL BAND SELECTION

[75] Inventors: Vincent P. Friberg, Longmeadow; Chester R. Kruczek, East Longmeadow, both of Mass.

[73] Assignee: General Instrument Corporation, Clifton, N.J.

[21] Appl. No.: 874,262

[22] Filed: Feb. 1, 1978

[51] Int. Cl.² ............................ H03H 5/12; H04B 1/06
[52] U.S. Cl. ..................................... 334/15; 325/459; 325/464
[58] Field of Search ................... 334/11, 15, 55, 56; 325/459, 461, 462, 464, 465

[56] References Cited

U.S. PATENT DOCUMENTS

| 3,646,450 | 2/1972 | Ma | 325/465 |
|---|---|---|---|
| 3,715,671 | 2/1973 | Worcester | 334/15 |
| 3,942,121 | 3/1976 | Bell et al. | 325/464 |
| 3,942,122 | 3/1976 | Nakanishi | 325/464 |
| 4,075,567 | 2/1978 | Klank et al. | 325/464 |

FOREIGN PATENT DOCUMENTS

2429506 4/1975 Fed. Rep. of Germany ............. 334/15

*Primary Examiner*—Alfred E. Smith
*Assistant Examiner*—Harry E. Barlow
*Attorney, Agent, or Firm*—James & Franklin

[57] ABSTRACT

The electronic tuning system includes a station selector, a memory, control circuitry, a display and a tuner having the reception band thereof divided into three segments. The tuner incorporates several resonant frequency circuits, each comprising a signal control varactor and a plurality of series connected inductors. Band switching circuitry is provided to simultaneously operatively delete selected inductors from each of the resonant circuits, in accordance with signals generated in a band segment selection circuit. Station selection signals are generated in accordance with the actuation of the signal selector and a display driver circuit is provided to generate a station frequency code to drive the display. The digital band segment selection circuitry generates band segment selection signals in accordance with the station frequency code. The band segment selection circuitry comprises a line decoder, which converts the station frequency code to a decimal number; a plurality of shift registers and bistable circuits which latch the decimal number being multiplexed; and a logic circuit which decodes the decimal number to provide the band segment selection signals to the band switching means.

18 Claims, 7 Drawing Figures

ELECTRONIC TUNING SYSTEM WITH DIGITAL BAND SELECTION

The present invention relates to an electronic tuning system including a tuner having a segmented reception band and a control circuit therefore and more particularly, to such a system incorporating means for digitally generating band segment selection signals to accomplish band segment selection in the tuner.

Electronic tuning systems incorporating varactor tuned resonant frequency circuits are commonly used and well known in the art. Such resonant frequency circuits comprise a signal controlled variable capacitance diode, commonly called a varactor, connected in series with one or more inductances. The D.C. voltage signal input to the varactor controls the capacitance thereof, thereby determining the resonant frequency of the circuit.

Conventional receivers designed for automotive use normally utilize "permability type" tuning to cover the reception band (540–1600 KHZ). This type of tuning utilizes a fixed capacitance and an inductance coil having a metallic core movable in accordance with the actuation of a mechanical station selector, in order to vary the inductance thereof and thus the resonant frequency of the tuning circuit.

While the desirability of utilizing an all electronic tuning system incorporating varactor tuned resonant frequency circuits in an automotive receiver has been recognized, as a practical matter, it is difficult to obtain good performance characteristics in such a system. Some of the problems which are encountered when varactor tuned resonant circuits are utilized in this application relate to the requirement for excessively large capacity varactors to tune across the entire band; impedance variations across the band causing unduly large gain changes in the resonant circuits and the inability to achieve suitable coupling of conventional automotive antennas to the tuner.

Conventional automotive antennas normally consist of a vertical "whip" antenna connected to a receiver through a shielded cable. This combination appears as a capacity of approximately 90 PF across the varactor diode in the antenna stage of the receiver, thereby limiting the tuning range of the device. A broadband transformer may by employed as a matching device between the antenna and RF amplifier stage, but this usually results in performance compromises since noise figure and cross-modulation characteristics suffer.

Cross-modulation results when a strong undesired signal, in the vicinity of a weak desired signal, modulates the desired signal and is detected. Since a broadband transformer has little or no selectivity, a system utilizing such a transformer is highly susceptible to cross-modulation problems. Additionally, losses in the broadband transformer will degrade the signal-to-noise figure.

In order to overcome these problems and thus achieve acceptable performance, the reception band may be divided into a number of different band segments. This permits a reduction in the size of varactor by reducing the range through which the varactor is required to tune. As a result, the large impedance variations normally present as the resonant circuit is tuned across the entire reception band, which cause gain changes, are sharply reduced. Further, the problems encountered in coupling the antenna to the tuner can be overcome through the use of a specially designed varactor tuned resonant circuit in the antenna stage.

The reception band of 540–1600 KHZ represents a frequency ratio of nearly 3 to 1. In order to reduce this ratio, the band is divided into a number of segments, for example three segments, and the frequency ratio required to tune each of the segments is therefore only 1.44 to 1. While the band could be divided into two or more than three segments, when simplicity and cost are considered, it is preferable to divide the band into three segments. The present invention is described with the reception band divided into three segments, for purposes of simplicity of explanation. However, it is to be understood that the band can be divided into any number of segments which are desired and that the present invention is not to be considered limited to a specific number of band segments.

In order to perform band segment selection, it is necessary to provide a circuit which will generate the necessary band segment selection signals. Each of the resonant circuits within the tuner are provided with three series connected inductances. The band selection signals are utilized to simultaneously operatively delete selected ones of the inductances from each of the resonant circuits in order to switch between the band segments.

It is desirable to utilize a digitally actuated phase locked loop system to provide the varactor control signal. In such a system, it is necessary that the band segment selection signals be digitally generated, so as to be compatible with the remainder of the control apparatus.

Thus, we have found that in order to achieve a high performance all electronic receiver designed for automotive use, it is necessary that the reception band be divided into a number of band segments, that a digital band segment selection signal generating means be developed which is compatible with the remainder of the electronic control apparatus and that a specially designed resonant frequency circuit be utilized in the antenna stage of the tuner in order to properly couple the antenna to the tuner.

It is therefore, the prime object of the present invention to provide an electronic tuning system with digital band selection wherein band selection signals are generated through the use of digital circuitry compatible with the remainder of the digital control apparatus.

It is another object of the present invention to provide an electronic tuning system with digital band selection wherein the reception band is divided into a plurality of segments, selected in accordance with digitally generated band selection signals, so as to overcome the problems associated with unduly large capacity varactors, normally required to tune over the entire reception band.

It is a further object of the present invention to provide an electronic tuning system with digital band selection wherein the resonant frequency circuit present in the antenna stage of the tuner is designed to achieve proper coupling with the antenna and still maintain adequate performance.

It is a still further object of the present invention to provide an electronic tuning system with digital band selection wherein impedance variations across the reception band, causing large gain changes, are greatly reduced.

It is still a further object of the present invention to provide an electronic tuning system with digital band selection wherein a phase locked loop is utilized in order to control the tuned frequency.

In accordance with the present invention, the electronic tuning system comprises a control circuit and a tuner having a varactor tuned resonant frequency circuit. The resonant circuit comprises a varactor connected to receive a varactor control signal and a plurality of series connected inductance means. Associated with the tuner are band switching means effective to operably delete selected ones of the inductance means from the resonant circuit, in accordance with band segment selection signals. Means are provided for generating station selection signals, in accordance with the actuation of a station selector and for generating a station frequency code to be displayed. Means are provided for generating varactor control signals in accordance with the station selection signal. Further, digital means, associated with the control circuit, are provided for generating the band segment selection signals, in accordance with the station frequency code.

The station frequency code and the station selector signals are utilized are to drive a LED digit display to display the tuned frequency. These signals include seven segment driver outputs and four digit driver outputs, the latter being the four horizontal outputs from the keyboard matrix of the signal selector. The band segment selection means is operably connected to receive these signals and comprises a seven to ten line decoder means, which converts the seven segment station frequency code into a decimal number. The number is multiplexed in accordance with the digit driver outputs. Three of the four digit driver outputs (the fourth is always zero) are used to respectively trigger three one-shot multivibrators. The outputs of the multivibrators and the decoder are utilized to drive a series of shift registers and bistable circuits which latch the decimal number being multiplexed. The outputs of the shift registers and bistable circuits are connected to a logic circuit comprising a series of logic gates. The logic circuit as two outputs, one for the 780 to 1120 KHZ band segment range and the other for the 1120 to 1610 KHZ band segment range. A band segment selection signal present on one of these outputs causes the band switching means of the tuner to simultaneously ground one or more of the inductance means present in each of the resonant circuits, so as to effect band segment selection.

A phase locked loop is utilized to generate the varactor control signal. The varactor control signal generating means includes means for sensing the frequency to which the resonant circuits are tuned, means for dividing the sensed frequency by a given number N, means for generating a reference frequency, means for comparing the reference frequency and the output of the dividing means and means for generating the DC signal in accordance with the difference between the reference frequency and the output of the dividing means. The given number N is selected in accordance with the station selection signal.

The variable portion of the given number is stored in a station counter which is set in accordance with the actuation of the signal selector or the data output of a programmable memory, preferably an EAROM, having stored therein data corresponding to a number of "favorite" stations. Means are provided for addressing the memory in accordance with actuation of the "favorite" station pushbuttons on the keyboard selector.

The tuner portion of the system comprises three stages, an antenna stage, a radio frequency stage and a local oscillator stage, each of which incorporates a resonant frequency circuit therein. Each of the resonant frequency circuits in each of the three stages is operatively connected to the bandswitching means which receives the digitally generated band segment selection signals such that band segment selection occurs simultaneously in the resonant frequency circuits of each stage.

The resonant frequency circuit of the antenna stage is of special design to provide coupling with the automotive "whip" type antenna in a manner which will achieve optimum performance. This resonant frequency circuit comprises, in addition to the varactor, an input node, an output node and a number of transformers equal to the number of band segments to be tuned, in this case, three. Each transformer comprises a first transformer winding, acting as the inductance means, and a second, output link winding. Each of the first transformer windings are connected in series. Each of the second output link windings are also connected in series. A fixed capacitor and the varactor connected in series through a first junction form series connected capacitors. The series connected capacitors are connected in parallel with the series connected first transformer windings. The input node forms a junction between the capacitances and the first transformer windings. The series connected output link windings are connected between the first junction and the output node.

A resonant frequency circuit of the above-described design provides an output having a substantially constant gain throughout each of the band segments and coupling with the automotive "whip" type antenna is achieved with excellence performance characteristics.

To the accomplishment of the above, and to such other objects as may hereinafter appear, the present invention relates to an electronic tuning system with digital band selection as described in the specification and recited in the annexed claims, taken together with the accompanying drawings, wherein like numerals refer to like parts and in which:

Figures 1, 1A:
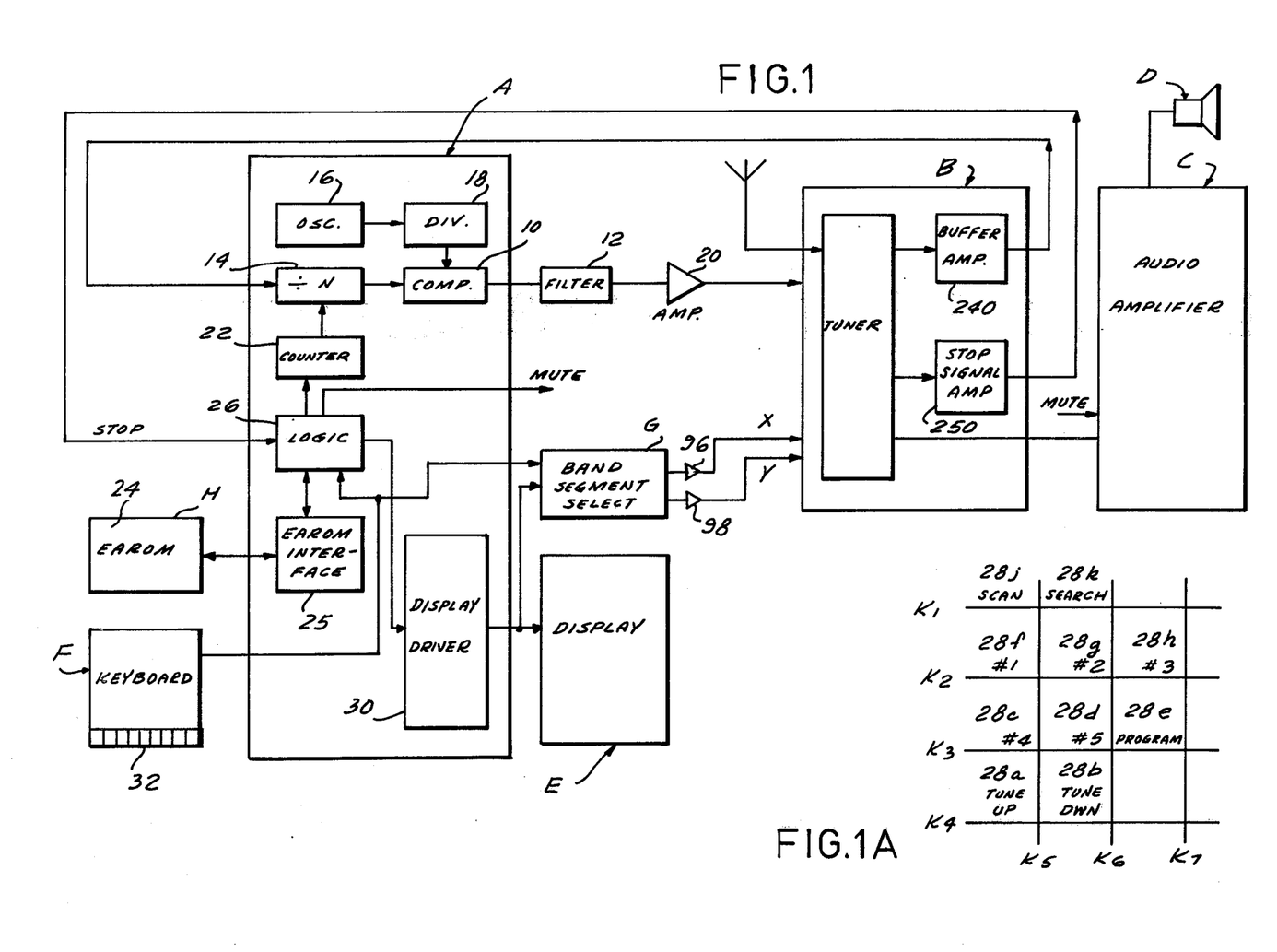
FIG. 1 is a block diagram of the electronic tuning system with digital band selection means of the present invention.
FIG. 1A is a schematic representation of the station selector utilized in the present invention.

As shown schematically in FIG. 1, the system of the present invention includes a tuner control circuit, generally designated A, operatively connected to drive a tuner, generally designated B. Tuner B is in turn connected to an audio amplifier, generally designated C, which drives a speaker, generally designated D. Tuner control circuit A is also connected to drive a digital display, generally designated E, which displays the frequency to which tuner B is conditioned to receive. Also associated with control circuit A are station selector F, digital band segment selection circuit G and a memory H.

Tuner B includes several varactor tuned resonant frequency circuits. One of the major functions of control circuit A is to provide the necessary varactor control signals, in the form of D.C. voltages, so as to condition the varactors in the resonant frequency circuits such that these circuits are tuned to the appropriate frequency. As mentioned previously, the reception band of tuner B is divided into three segments so as to reduce the size of the varactors in the resonant frequency circuits. It is a second major function of control circuitry A, in conjunction with band segment selection circuit G, to generate the necessary band segment selection signals to condition the tuner to select the appropriate band segment in accordance with the frequency to be tuned. A third major function of control circuit A is to generate the necessary segment driver signals to the display E such that display E generates indicia to display the frequency to which the tuner is tuned. The control circuit A utilized in the present invention is an integrated circuit package commercially available from General Instrument Corporation and designated AY-3-8115. Because this circuit is an "off the shelf" chip, the various operations thereof will herein be described only functionally.

The varactor control signals are generated in control circuit A by means of a phase locked loop system wherein a binary code decimal representation of the actual frequency to which tuner B is tuned, divided by a given number N which is a function of the frequency selected for tuning, is compared to an internally generated fixed reference signal. The output of the comparator is then processed to form D.C. voltages which are transmitted to the varactors in in tuner B. These varactor control signals adjust the capacities of the varactors to bring the circuit into balanced condition, that is, to cause the frequencies of the two signals being compared to be equal. This portion of the circuit includes a digital phase detector or comparator 10, a variable modulo counter 14, and a reference signal generating means including an oscillator 16 and a division circuit 18. Counter 14 receives the oscillator signal output from tuner B, which is representative of the actual frequency to which the tuner is tuned, and divides this frequency by a given number N, which is representative of the frequency of the selected station. The result of this division forms one input to comparator 10. The other input of comparator 10 is the fixed reference signal. This reference signal is developed by dividing the output (for example, 2.6 MHZ) of a crystal controlled oscillator 16 in a division circuit 18, to provide a constant output of, for example, 5 KHZ which is fed to comparator 10.

The output of comparator 10 is connected to a low pass filter 12, which in turn is connected to an amplifier 20 which generates the varactor control signal. When the phase and frequency of the output of counter 14 differs from the phase and frequency of the reference signal, comparator 10 generates an error voltage proportional to the phase and frequency difference. The error voltage is filtered in low pass filter 12 and then amplified in amplifier 20. The varactor control signal varies in the appropriate direction to reduce the frequency difference between the inputs to comparator 10. When the frequencies of the inputs to comparator 10 are sufficiently close, the closed loop nature of the phase locked loop forces tuner B to lock in frequency and to maintain this frequency until the output of counter 14 changes, that is, a different station is selected.

Counter 14 consists of a plurality of variable modulo counters, similar to the type which are available from National Semiconductor and other manufactures, and are designated as DM-7520. Cascading of these circuits will provide division by any number from two to very large numbers.

The function of counter 14 can best be understood by way of example. For purposes of this illustration, it will be assumed that the reference signal input to comparator 10 has a constant frequency of 5 KHZ. Thus, when tuner B is tuned to the desired frequency, the output of counter 14 will also be 5 KHZ. Assume that the frequency to which tuner B is tuned is 985 KHZ. In order to attain the desired 5 KHZ output from counter 14, a division of $N=197$ (985/5) is necessary. It is desirable to split the divider N into two parts $N_1$ and $N_2$. This can be done by first dividing by $N_1=91$ (455/5) where 455 KHZ is the intermediate frequency (IF) of tuner B, and then dividing by $N_2=106$ (530/5) where 530 KHZ is the carrier signal to which tuner B is tuned. The resultant is the same: $N=N_1+N_2=197$.

Assuming that the IF frequency divisor $N_1$ remains fixed, the overall divisor N can be changed by varying the carrier frequency divisor $N_2$. Changing $N_2$ is the method used for frequency selection of the station.

In this system, the binary coded decimal equivalent of the 455 KHZ IF signal is loaded into the 12 bit module N counter 14. The counter is clocked by the oscillator frequency of tuner B which, for purposes of this illustration, was chosen at 985 KHZ. When the counter reaches full count, it is loaded with the binary coded decimal equivalent of the carrier frequency, in this case 530 KHZ. After this is counted down, the output of the counter goes positive for one clock period. Continuous cycling of the above results in a 5 KHZ output frequency. Thus, the output of comparator 10 will be zero and the tuner will remain at the set frequency.

If the clock frequency of 985 KHZ or the carrier frequency divisor $N_2$ changes, the system will fall out of lock. For instance, a 2065 KHZ clock frequency from tuner B will result in a different counter output frequency. In this case, the counter output frequency will equal $(2065/985) \times 5 = 10.48$ KHZ.

It will now be necessary for comparator 10 to produce an output signal to correct the tuner oscillator down toward 985 KHZ. This is done, as described above, by generating a signal output which is representative of the detected phase and frequency difference between the output of counter 14 and the fixed referenced signal, so as to appropriately adjust the capacitance of the varactors in the resonant frequency circuits in tuner B.

The digital representation of frequency of the station desired to be tuned is stored in a 10 bit binary coded decimal presettable up/down counter 22 of conventional design, similar to CMOS 4029 available from Radio Corporation of America and other integrated circuit manufacturers. When the power to the system is turned on, data from a particular storage location of a memory 24, designated to remember the last station tuned, is read and preset into counter 22. At the proper time, determined by control logic circuit 26, this data is loaded into the counter 14 as $N_2$. Data is changed in station counter 22 by actuation of the station selector F, which interfaces with control logic circuit 26.

Control logic circuit 26 generates a series of pulses, in accordance with the actuation of station selector F, into the up/down input of station counter 22 thus increasing or decreasing the counter data, and thus $N_2$. Alternatively, actuation of one of the "favorite" station buttons of the station selector F causes programmed data at corresponding location in memory 24 to be transferred to counter 22.

Memory 24 is preferably an EAROM (electrically alterable read-only memory) of the type commercially available from the National Cash Register Corporation or from General Instrument Corporation as ER 1400. This memory has a plurality of storage locations one of which stores data relating to the last station tuned and the others of which may be programmed with information concerning "favorite" stations. The "favorite" stations can thus be tuned by the manipulation of a single one of five pushbuttons provided on station selector F for this purpose.

The actuation of the station selector causes control logic circuit 26 to generate pulses to adjust counter 22 to the appropriate count or to address memory 24 to load specific data into counter 22. The first mode is used when the "tune-up", "tune-down" or 'search' buttons are actuated. Actuation of the appropriate "favorite" station pushbutton in station selector F causes control logic chip 26 by means of EAROM interface circuit 25, to address the corresponding memory location in memory 24 and to read the data therein to appropriately adjust the count in counter 22. This count is thereafter transferred into counter 14 and utilized as the carrier frequency divisor $N_2$. Station selector F preferably comprises a 3×4 matrix including five pushbuttons 32 actuatable to tune five "favorite" stations as well as "tune-up", "tune-down", "scan", "search" and program pushbuttons. Such station selectors are well known in the art.

Control logic 26 also provides an interface between station selector F and the display driver 30 and band segment select circuitry G. Control logic 26, in addition, generates the "Mute" signal to the audioamplifier C.

Tuner B, as explained in detail below, generates a "stop" signal when a station is received. This "stop" signal is transferred to control logic circuit 26. A single momentary depression of the "tune-up" (or "tune-down") key will cause the tuner to move up (or down) the band by 10 KHz. Continuous depression of the button allows traversing of the entire band in the appropriate direction. This function is automatically disabled at the end of the band. In the "search" mode, the tuner is incremented in 10 KHz steps until a "stop" signal indicates the presence of a strong signal. In the "scan" mode, each received station in sequence is locked in for a given time period to permit monitoring thereof. If the "scan" key is again depressed, the scan is terminated. Thus, the "scan" mode is similar to the "search" mode but the scan stops intermittently, at selected sets of stations.

As can be best seen in FIG. 1A, station selector F comprises a three by four matrix keyboard of conventional design with ten pushbuttons 28a–28k. Depression of buttons 28a, 28b, 28j and 28k cause the initiation of the tune up, tune down, scan and search modes, respectively. Buttons 28c, 28d, 28f, 28g, and 28h are the five "favorite" station buttons. Buttons 28e is utilized when programming the memory.

Figure 2:
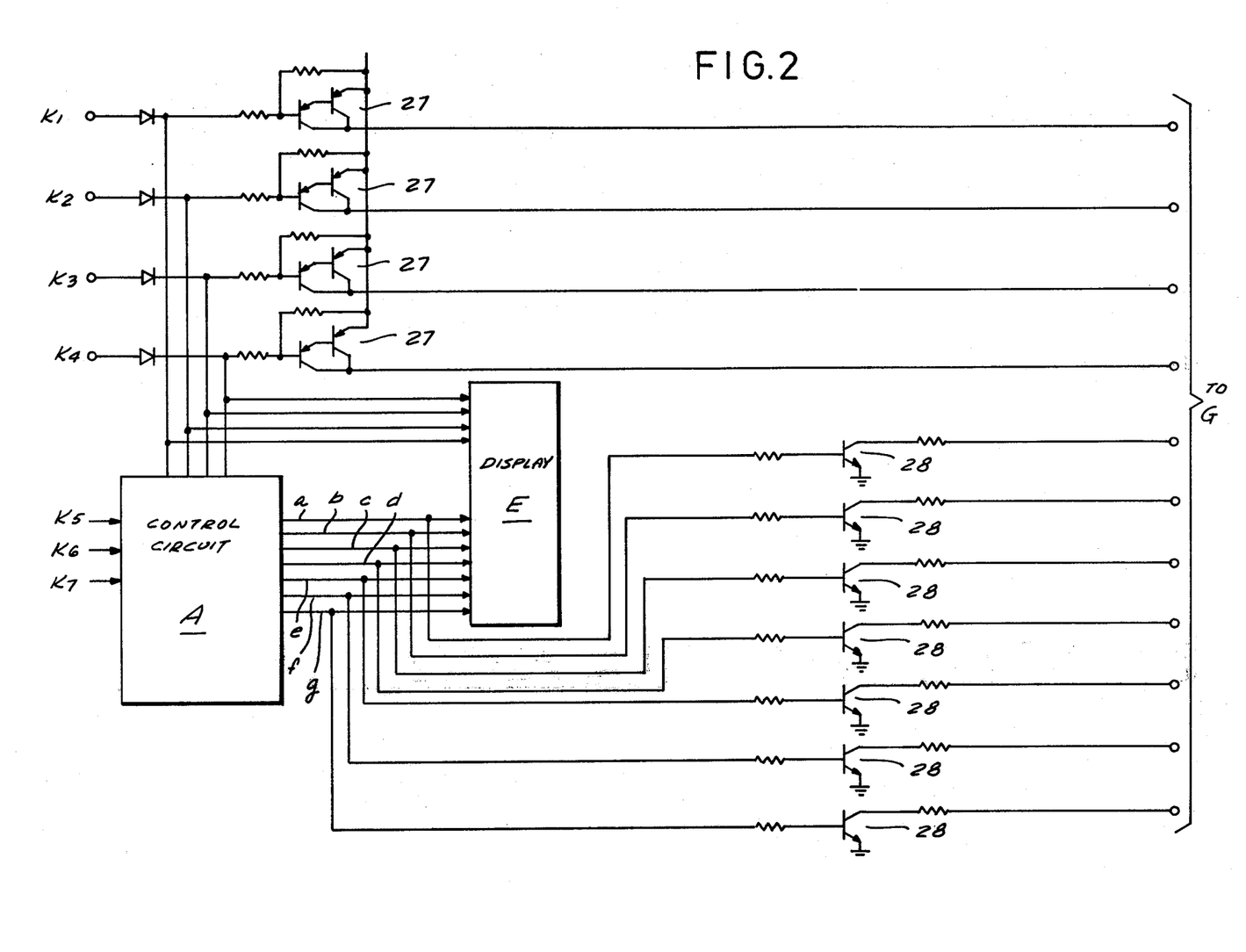
FIG. 2 is a more detailed block diagram of the connections between the station selector, control circuit, display and tuner.

Keyboard F has seven outputs designated K1–K7 each of which is connected to control circuit A as shown in FIG. 2. Each of the outputs K1–K4 are connected to display E to form the digit driver inputs therefore. Outputs K1–K4 are also connected through transistor circuits 27 to band segment selection circuit G, as indicated.

The display driver circuit 30, located within control circuit A, generates seven outputs, designated a, b, c, d, e, f and g, which are also fed through individual transistor circuits 28 to band segment selection circuit G. Further, outputs a–g form the segment driver inputs for the display E.

Figure 3:
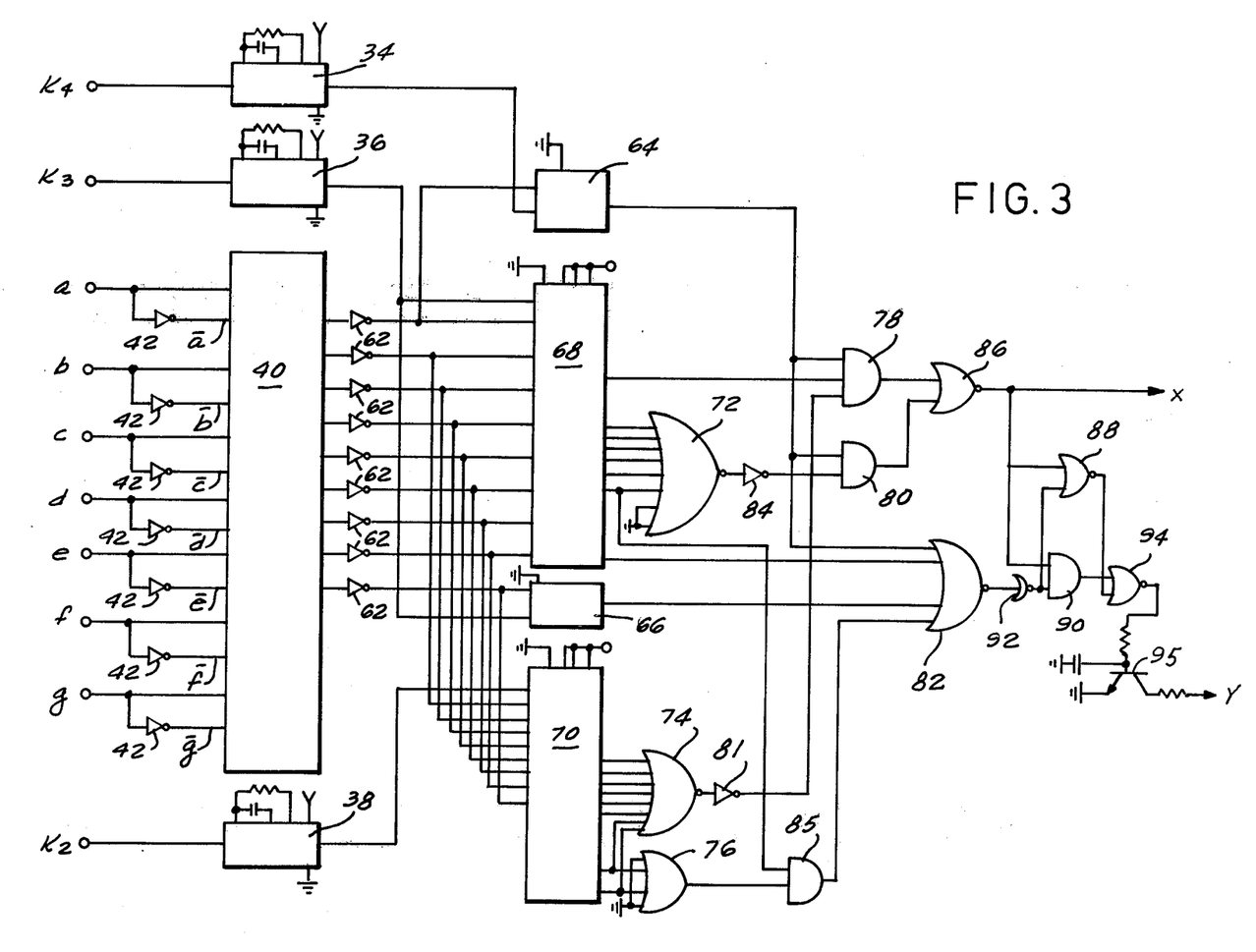
FIG. 3 is a schematic diagram of the digital band selection means of the present inventin.

As shown in FIG. 3, the band segment selection circuit G includes three one shot multi-vibrators 34, 36 and 38. Each of the multi-vibrators 34, 36 and 38 receive, as its trigger input, one of three of the four digit driver outputs K2, K3, and K4. A fourth multi-vibrator for the fourth digit driver output K1 is not required because this decimal number is always zero. Each of the seven segment driver outputs a–g forms one of seven inputs to a seven to ten line decoder 40, the circuitry of which is described in detail below. In addition, each of the seven segment driver outputs a–g is fed to a separate inverter 42, to create the complements of the segment driver inputs, $\bar{a}, \bar{b}, \bar{c}, \bar{d}, \bar{e}, \bar{f}$ and $\bar{g}$, such that the decoder 40 has in total fourteen separate inputs.

Figure 4:
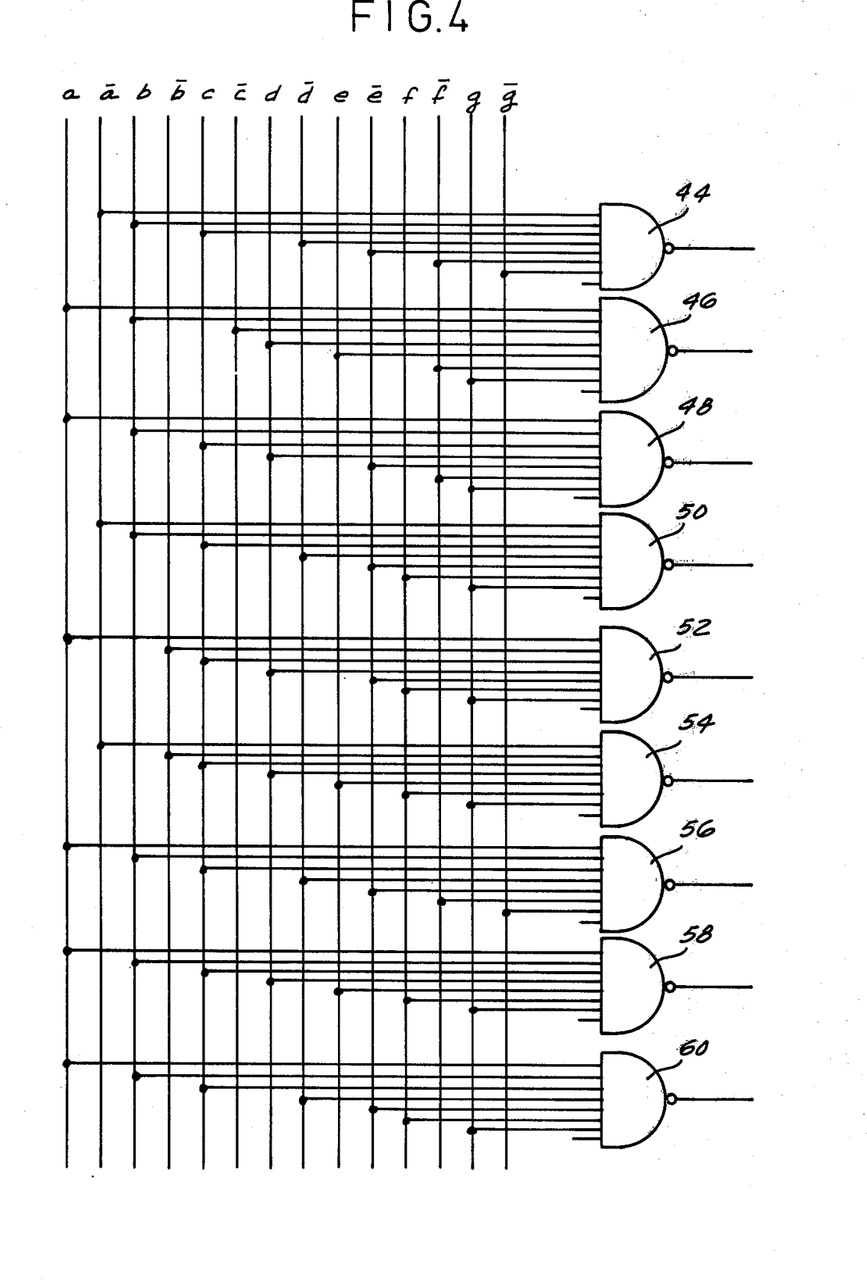
FIG. 4 is a schematic diagram of the line decoder which forms a portion of the digital band selection means of the present invention.

FIG. 4 is a schematic diagram of decoder 40. The fourteen inputs a, b, c, d, e, f, g and $\bar{a}, \bar{b}, \bar{c}, \bar{d}, \bar{e}, \bar{f}$, and $\bar{g}$ are fed to different ones of fourteen vertical buses. A plurality of nine NAND gates 44, 46, 48, 50, 52, 54, 56, 58 and 60, each of which has either inputs, are provided. Seven out of the eight inputs for each of the NAND gates 44–60 are connected to the input buses, the eighth input always receives a high or logic one signal of 12 volts.

When each of the inputs to an NAND gate receives a high or logic one signal, the gate will produce a low or logic zero output. For instance, NAND gate 44 has its inputs connected to the $\bar{a}$, b, c, $\bar{d}$, $\bar{e}$, $\bar{f}$, and $\bar{g}$ input buses. Therefore, when the signal on each of these lines is high or logic one, NAND gate 44 will generate a low or logic zero output. The outputs of gates 44–60 represents a decimal number which is a function of the displayed signal frequency.

Referring back to FIG. 3, each of the nine outputs from decoder 40 is inverted in a separate inverting amplifier 62. The outputs of inverting amplifiers 62, and of one shot mutli-vibrators 34, 36 and 38, are utilized as the inputs to bistable circuits 64 and 66, each of which comprises a flip-flop circuit, and to a pair of shift registers 68 and 70. The bistable circuits and shift registers latch the decimal number being multiplexed. More particularly, the inverted output of NAND gate 44 and the output of multi-vibrator 34 form the D and clock inputs respectively to flip-flop 64. The inverted output of NAND gate 60 and the output of multi-vibrator 36 form the inputs to flip-flop 66. The inverted outputs of NAND gates 44, 46, 48, 50, 52, 54, 56 and 58 and the output of multi-vibrator 36 form the inputs to shift register 68. In a similar manner, the inverted outputs from NAND gates 46, 48, 50, 52, 54, 56, 58 and 60 and the output of multi-vibrator 38 form the inputs to shift register 70.

The outputs of flip-flops 64 and 66 and shift registers 68 and 70 are fed to a logic circuit, formed of a plurality of logic gates, which decodes the decimal number and generates the band segment selection signals. The logic circuit includes two eight input NOR gates 72, 74. NOR gate 72 is connected to receive six outputs from shift register 68. The other two inputs of NOR gate 72 are tied to ground. NOR gate 74 receives all eight of the outputs from shift register 70. Two of the outputs from shift register 70 are also connected to two inputs of OR gate 76, the other inputs of which are connected to ground.

The output of flip-flop 64 is connected as one of the inputs of a three input AND gate 78, one of the inputs of a two input AND gate 80, and one of the inputs to a four input NOR gate 82. The other inputs for AND gate 78 are connected respectively to one of the outputs of shift register 68 and to the output of an inverter 81, the latter being connected to NOR gate 74. The second input for AND gate 80 is connected to an inverter 84 which in turn is connected to receive the output of NOR gate 72. NOR gate 82 is also connected to receive an input from shift register 68 and from flip-flop 66, as well as the output from a two input AND gate 85, the inputs of which are connected to OR gate 76 and shift register 68, respectively. The outputs of gates 78 and 80 form the inputs of a two input NOR gate 86.

The output of NOR gate 86 forms one of the band segment switching signals X (1120–1610 KHZ). This output is, in addition, fed to one of the inputs of a NOR gate 88 and one of the inputs to an AND gate 90. A single input NOR gate 92 is connected to receive the output of NOR gate 82 and to provide the other input for NOR gate 88 and AND gate 90, respectively. The outputs of NOR gate 88 and AND gate 90 provide the inputs to NOR gate 94. The output of gate 94 is fed to the input terminal of a transistor 95, the output of which forms the second band segment selection signal Y (780–1120 KHZ).

The band segment selection signals X and Y are connected to the band switching circuitry in tuner B by means of a pair of band selection signal amplifiers 96 and 98. The manner in which the band segment selection signals are utilized within tuner B in order to provide the band segment selection function will best be understood with reference to FIGS. 5A and 5B, which show a schematic diagram of the tuner and associated circuitry.

Figure 5A:
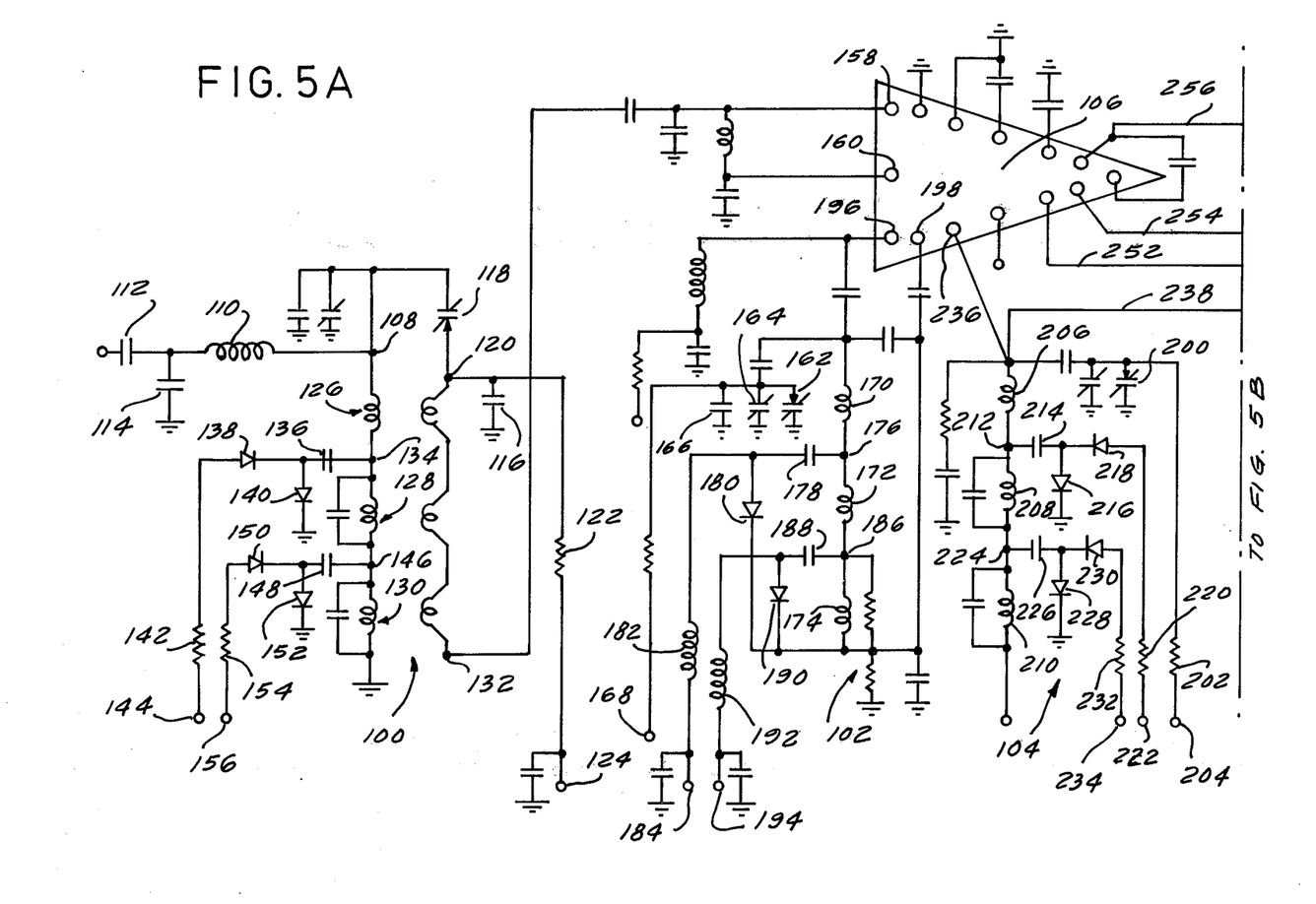
FIGS. 5A and 5B together form a schematic diagram of the tuner of the electronic tuning system of the present invention.

As shown in FIG. 5A, the tuner comprises three resonant frequency circuits, generally designated 100, 102 and 104 respectively for each of the antenna, radio frequency, and oscillator stages thereof. Each of these resonant frequencies circuits 100, 102, 104 is connected to an integrated circuit package 106 which includes an RF amplifier, and IF amplifier, a mixer, an oscillator, an automatic gain control (AGC) detector and a voltage regulator. Such an integrated circuit is commercially available from Radio Corporation of America and is designated as CA 3123E.

The resonant frequency circuit 100 of the antenna stage of tuner comprises an input node 108, which is connected to the antenna (not shown) by means of an inductor 110 and a capacitor 112, the junction therebetween being connected to a grounded capacitor 114. A fixed capacitor 116 and a varactor 118 are connected in a series through a node 120 which in turn is connected, by means of a resistor 122, to node 124, which receives the varactor control signal. The circuit also includes three transformers 126, 128 and 130, each having a first transformer winding, which acts as an inductor, and a second output link winding. The first transformer windings of each of the transformers 126, 128 and 130 are connected in series between ground and input node 108. The second output link windings of transformers 126, 128 and 130 are connected in series between the circuit output node 132 and node 120.

The junction node 134 between the first transformer windings of transformers 126 and 128 is connected to a portion of the band segment switching circuitry which comprises a capacitor 136, a pair of switching diodes 138, 140 and a resistor 142. Resistor 142 is connected to receive, by means of node 144, the band segment selection signal X from band segment selection circuitry G. The presence of a signal X at node 144 turned on diodes 138 and 140, the latter of which is connected to ground, thereby grounding the first transformer windings of transformers 128 and 130. This serves to operatively delete transformers 128 and 130 from the circuitry, thereby selecting the 1120–1610 KHZ segment.

In a similar manner, the junction node 146 located between the first transformer windings of transformers 128 and 130, is connected to a second portion of the band segment switching circuitry, which comprises a capacitor 148, a pair of switching diodes 150, 152 and a resistor 154. Resistor 154 is connected to node 156 which, in turn, is connected to receive the Y band segment selection signal from circuit G. The presence of the Y signal at node 156 turns on diodes 150 and 152, the latter of which is connected to ground, thereby grounding transformer 130. In this manner, the inductance represented by the winding of transformer 130 is operatively deleted from the circuit and the 780–1120 KHZ segment of the band is selected. In the absence of signals X and Y on nodes 144 and 156, all three inductances are operatively connected in the resonant circuit and the band segment between 530 and 770 KHZ is selected. The output node 132 of resonant frequency circuits 100 is connected to input nodes 158 and 160 of IC 106.

The resonant frequency circuit 102 of the RF stage of the tuner includes a varactor 162, connected in parallel with capacitors 164 and 166. Varactor 162 receives the varactor control signal present at node 168. Three inductors, 170, 172 and 174 are connected in series to form the inductance for resonant frequency circuit 102. The junction node 176, between inductors 170 and 172, is connected to a portion of the band segment switching circuitry. This portion comprises a capacitor 178, a switching diode 180 and an inductor 182, which is connected to node 184. Node 184 receives the X band segment selection signal, as does node 144 and when this signal is present, diode 180, which is connected to ground, serves to ground inductors 172 and 174 to operatively delete same from the resonant circuit, in order to perform selection of the 1120–1610 KHZ band segment. In a similar manner, junction node 186, located between inductors 172 and 174, is connected to a portion of the band segment switching circuitry which comprises a capacitor 188, a switching diode 190 and an inductor 192 the latter of which is connected to a node 194. Node 194 receives the Y band segment selection signal, as does node 156, and when this signal is present, switching diode 190 grounds inductor 174, thereby operatively deleting this inductor from the resonant circuit in order to select the 780–1110 KHZ band segment. When no signals are present at either node 184 and 194, the 530–770 KHZ band segment is selected. Resonant frequency circuit 102 is connected to IC Chip 106 through nodes 196 and 198.

The resonant frequency circuit 104 comprises a varactor 200, which is connected through resistor 202 to node 204, which in turn receives the varactor control signal. Three inductors 206, 208 and 210 are connected to the varactor to form resonant frequency circuit 104. Junction node 212, located between inductors 206 and 208, is connected to a portion of the band segment selection circuitry which comprises a capacitor 214, a pair of switching diodes 216, 218 and a resistor 220, the latter of which is connected to node 222. Node 222 is connected, along with node 144 and node 184, to receive the X band segment selection signal from circuit 32. When this signal is present at node 222, diodes 218 and 216 are turned on, the latter of which is connected to the ground. In this manner, inductances 208 and 210 are grounded and therefore operatively deleted from the circuit and the 1120-1610 KHZ segment is selected. A junction node 224, situated between inductors 208 and 210, is connected to a portion of the band segment switching circuitry which comprises capacitor 226, switching diodes 228 and 230 and resistor 232. Resistor 232 is connected to node 234 which, along with node 156 and 194, are connected to receive the Y band segment selection signal from circuit 32. When the signal is present at node 234, switching diodes 230 and 228, the latter of which is connected to ground, are turned on thereby, operatively deleting inductor 210 from the resonant frequency circuit 104 to select the 780-1110 KHZ band segment. Resonant frequency circuit 104 is connected to IC 106 through node 236.

Figure 5B:
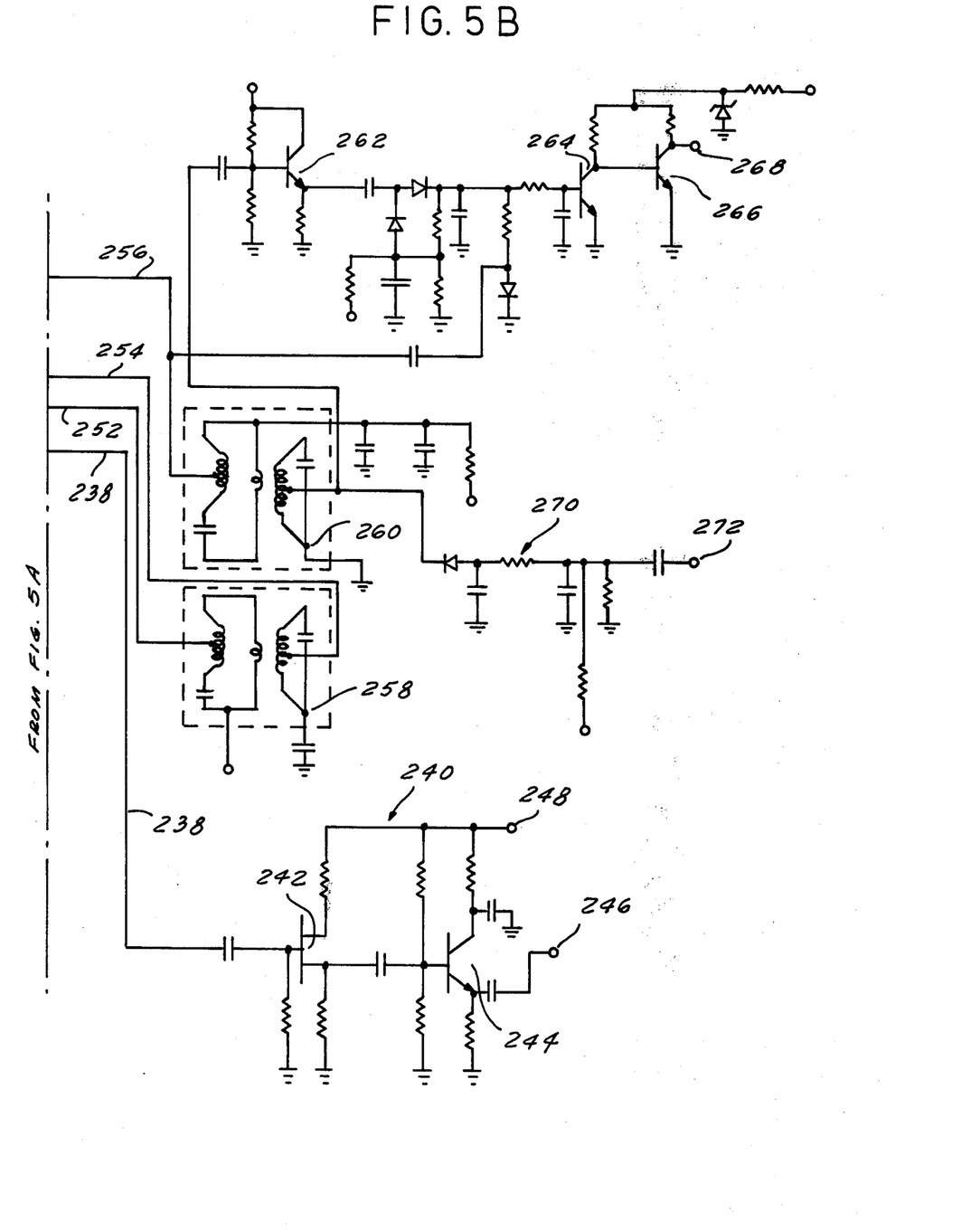

The output of the resonant frequency circuit 104 of the oscillator stage of the tuner is also connected, by means of bus 238 to buffer amplifier 240 shown on FIG. 5B. Bus 238 is connected to the control terminal of a J type FET 242, connected as a source follower, thereby providing light loading of the oscillator circuit. One of the output terminals of transistor 242 is connected to the control terminal of a transistor 244 which is connected as an emitter follower and provides a low impedance to feed output node 246. The other output node 248, which is connected to the second output of terminal transistor 242, forms the second input to a dual line which transmits the local oscillator signal to counter 14.

Lines 252 and 254, from IC 106, are connected to a transformer 258 which is situated between the mixer output and IF input of the IC 106. A transistor 262, connected to line 256 from IC 106, samples the IF frequency through transistor 262. With an IF carrier present, a positive voltage appears at the base of the transistor 264. Transistor 266 reverses the polarity of this signal so that a positive signal appearing on the base of transistor 264 results in a positive output at the collector of transistor 266. This signal, which appears on node 268, is connected to control circuit A and is utilized as a "stop" signal to cause the "search" operation to pause as this signal represents the detection of received station.

The output of transformer 260 is also connected to an IF modulator circuit 270, the output 272 of which is connected as an input to audio amplifier C. Audio amplifier C also receives a "mute" signal from control circuit A, which causes the audio amplifier to remain mute between stations.

As now can be readily appreciated, the varactors 118, 162 and 200 of resonant frequency circuits 100, 102 and 104 respectively, are all tied to receive the same varactor control signal through nodes 124, 168 and 204 respectively. In this manner each of the resonant frequency circuits is tuned to the same frequency. Further, band segment selection takes place simultaneously in each of the resonant frequency circuits 100, 102 and 104. When no band segment selection signals are present, each of the resonant frequency circuits includes each of the three inductances therein. In this mode, the 530 to 770 KHZ band segment is selected. The presence of the Y band selection signal on nodes 156, 194 and 234 causes one of the inductances in each of the resonant frequency circuits to be operatively deleted thereby causing the selection of the 780-1120 KHZ band segment. The presence of a X band selection signal at nodes 144, 184 and 222 causes two of the inductances in each of the resonant frequency circuits to be operatively deleted therefrom thereby causing the band segment between 1120-1610 KHZ to be selected. Thus, the digitally generated band segment selection signals cause simultaneous band switching in each of the frequency resonant circuits within tuner B.

It should therefore be appreciated that the present invention is an all-electronic tuning system wherein the reception band is divided into a plurality of band segments so as to eliminate the need for unduly large varactors. Band selection is accomplished simultaneously in each of the resonant frequency circuits of the tuner through the use of digitally generated band segment selection signals. Within each of the resonant frequency circuits, band segment selection is achieved by operatively deleting one or more of the inductances, in accordance with the presence or absence of the band segment selection signals. The band segment selection signals are generated digitally through the use of a line decoder, by converting the seven segment station frequency code to a decimal number. The decimal number is multiplexed in accordance with the digit driver signals and shift registers and flip flops are used to latch the decimal numbers being multiplexed. Decoding of the band switching frequencies is accomplished through combination logic which in turn provides the band segment selection outputs.

The system incorporates a phase lock loop type of tuning by which the varactor control signals are generated. Further, a specially designed resonant frequency circuit is utilized in the antenna stage of the tuner in order to achieve excellent noise figure and cross-modulation characteristics.

While only a single preferred embodiment of the present invention is disclosed herein, it is obvious that many modifications and variations can be made thereto. It is intended to cover all of these variations and modifications which fall within the scope of the invention as set forth in the following claims.

We claim:

1. An electronic tuning system or the like comprising: a tuner having a varactor tuned resonant circuit comprising a plurality of series connected inductors and band switching means operably connected to said inductors to operably delete selected ones of said inductors from said resonant circuit in accordance with band segment selection signals; a station selector generating station selection signals in accordance with the actuation thereof; control circuitry operably connected to said station selector and comprising means for generating a varactor control signal in accordance with said station selection signals and means for generating a display code representative of the frequency selected; means for displaying indicia corresponding to said display code; and digital means for generating band segment selection signals, said digital means comprising means for converting said display code into a decimal number and means for decoding said decimal number to form said band segment selection signals.

2. The system of claim 1 wherein said converting means comprises a line decoder and means for inverting the digits of said display code, said decoder receiving, as a first set of inputs, said display code, and as a second set of inputs, the inverted version of said display code, the output of said line decoder forming said decimal number.

3. The system of claim 1 further comprising means for latching said decimal number.

4. The system of claim 2 further comprising means for latching said decimal number.

5. The system of claim 4 wherein said latching means comprises a shift register and a bistable circuit.

6. The system of claim 5 wherein said decoding means comprises a plurality of logic gates.

7. The system of claim 6 wherein said digital means comprises a plurality of monostable circuits connected to receive selected ones of said station selection signals.

8. The system of claim 7 wherein the outputs of said monostable circuits comprise additional inputs to said latching means.

9. The system of claim 1 wherein said varactor control signal generating means comprises means for sensing the frequency to which said resonant circuit is tuned, means for dividing said sensed frequency by a given number, means for generating a reference frequency, means for comparing said reference frequency with the output of said dividing means and means for generating a signal in accordance with the difference between said reference frequency and the output of said dividing means.

10. The system of claim 9 further comprising a memory having stored therein a plurality of data words, each of which corresponds to a different frequency to be tuned.

11. The system of claim 10 further comprising means for addressing said memory in accordance with said station selection signal.

12. The system of claim 11 wherein said given number is selected in accordance with said station selection signal or a selected one of said data words.

13. The system of claim 1 wherein said resonant frequency circuit further comprises an input node, an output node, a plurality of transformers, each having a first transformer winding acting as one of said inductors and a second output link winding, each of said first transformer windings being connected in series, each of said output link windings being connected in series, a fixed capacitance connected in series with said varactor through a first junction to form series connected capacitances, said series connected capacitances being connected in parallel with said series connected first transformer windings, said input node forming a junction between said capacitances and series connected first transformer windings, and said series connected output link windings being connected between said first junction and said output node.

14. The system of claim 13 wherein said resonant circuit forms a portion of the antenna stage of said tuner.

15. The system of claim 14 wherein said resonant circuit has a substantially constant gain throughout each band.

16. The system of claim 8 wherein said resonant frequency circuit further comprises an input node, an output node, a plurality of transformers, each having a first transformer winding acting as one of said inductors and a second output link winding, each of said first transformer windings being connected in series, each of said output link windings being connected in series, a fixed capacitance connected in series with said varactor through a first junction to form series connected capacitances, said series connected capacitance being connected in parallel with said series connected first transformer windings, said input node forming a junction between said capacitance and series connected first transformer windings and said series connected output link windings being connected between said first junction and said output node.

17. The system of claim 16 wherein said resonant circuit forms a portion of the antenna stage of said tuner.

18. The system of claim 17 wherein said resonant circuit has a substantially constant gain throughout each band.

* * * * *